(12) United States Patent
Li et al.

(10) Patent No.: US 11,393,684 B2
(45) Date of Patent: Jul. 19, 2022

(54) METHOD OF MANIPULATING DEPOSITION RATES OF POLY-SILICON AND METHOD OF MANUFACTURING A SIGE HBT DEVICE

(71) Applicant: Shanghai Huahong Grace Semiconductor Manufacturing Corporation, Shanghai (CN)

(72) Inventors: Zhenqi Li, Shanghai (CN); Gim Chye Owe, Shanghai (CN); Ronghao Fu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 17/145,070

(22) Filed: Jan. 8, 2021

(65) Prior Publication Data
US 2022/0172950 A1   Jun. 2, 2022

(30) Foreign Application Priority Data

Nov. 27, 2020 (CN) .......................... 202011360222.6

(51) Int. Cl.
*H01L 29/00* (2006.01)
*H01L 21/02* (2006.01)
*H01L 29/66* (2006.01)

(52) U.S. Cl.
CPC .... *H01L 21/02656* (2013.01); *H01L 21/0262* (2013.01); *H01L 21/02532* (2013.01); *H01L 21/02573* (2013.01); *H01L 21/02595* (2013.01); *H01L 29/66242* (2013.01)

(58) Field of Classification Search
CPC ................................................. H01L 29/66242
See application file for complete search history.

(56) References Cited

U.S. PATENT DOCUMENTS

| | | | |
|---|---|---|---|
| 2003/0098465 A1* | 5/2003 | Suzumura | H01L 29/7378 257/197 |
| 2017/0098699 A1* | 4/2017 | Camillo-Castillo | H01L 21/762 |

* cited by examiner

*Primary Examiner* — Reema Patel
(74) *Attorney, Agent, or Firm* — Harness, Dickey & Pierce, P.L.C.

(57) ABSTRACT

A method of manipulating deposition rates of poly-silicon and a method of manufacturing a silicon-germanium (SiGe) heterojunction bipolar transistor (HBT) device are provided. The method of manipulating deposition rates of poly-silicon includes: providing a substrate, where a first surface of the substrate includes at least two of an oxide material region, a silicon nitride material region and a silicon material region; performing a first treatment on the first surface of the substrate, so as to manipulate the deposition rates of poly-silicon on different regions of the first surface to be closer; and forming a poly-silicon layer on the first surface of the substrate.

11 Claims, 8 Drawing Sheets

(a) (b)

(a) (b)

(a)  (b)

METHOD OF MANIPULATING DEPOSITION RATES OF POLY-SILICON AND METHOD OF MANUFACTURING A SIGE HBT DEVICE

CROSS-REFERENCE TO RELATED APPLICATIONS

This application claims the benefit of priority to Chinese Patent Application No. 202011360222.6, filed on Nov. 27, 2020, and entitled "METHOD OF MANIPULATING DEPOSITION RATES OF POLY-SILICON AND METHOD OF MANUFACTURING A SIGE HBT DEVICE", the entire disclosure of which is incorporated herein by reference.

TECHNICAL FIELD

The present disclosure generally relates to semiconductor manufacturing field, and more particularly, to a method of manipulating deposition rates of poly-silicon and a method of manufacturing a silicon-germanium (SiGe) heterojunction bipolar transistor (HBT) device.

BACKGROUND

With the development of modern mobile communication and microwave communication as well as demands for high-performance, low-noise and low-cost radio frequency (RF) devices, traditional silicon devices can no longer meet new requirements on technical specifications, output power and linearity. Therefore, SiGe HBT devices have been proposed which play an important role in the applications of RF devices. Firstly, an energy band difference between SiGe and silicon can be used to improve carrier injection efficiency of an emitter region of a device, so as to increase a current amplification factor of the device; secondly, heavy doping of a SiGe base can be used to reduce base resistance and increase characteristic frequency. Furthermore, SiGe HBT devices are known to be well compatible with the conventional silicon process, which can reduce manufacturing cost. Therefore, SiGe HBT devices have become more and more popular in the applications of RF devices.

The fabrication process of a SiGe HBT device usually utilizes heavily doped collector buried layer to reduce the collector resistance. This process uses high dose and high energy implant of N-type doping to form collector buried layer connection and to form collector pick-up. The epitaxial layer on the collector buried layer forms the medium or low doped collector. Next, the base is constructed by P-type doped SiGe epitaxial layer, and finally the emitter is formed by heavily doped N-type poly-silicon.

In order to obtain a SiGe HBT device with higher frequency, the emitter opening of the SiGe HBT device needs to be scaled or reduced continuously, which is hard for manufacturing. Therefore, a method of improving poly-silicon deposition in smaller emitter area is urgently needed.

SUMMARY

Embodiments of the present disclosure provide a method of manipulating deposition rates of poly-silicon and a method of manufacturing a silicon-germanium (SiGe) heterojunction bipolar transistor (HBT) device. Performance of the SiGe HBT device is improved with reducing cost by utilizing the methods.

In an embodiment of the present disclosure, a method of manipulating deposition rates of poly-silicon is provided, including: providing a substrate, where a first surface of the substrate includes at least two of an oxide material region, a silicon nitride material region and a silicon material region; performing a first treatment on the first surface of the substrate, so as to manipulate the deposition rates of poly-silicon on different regions of the first surface to be closer; and forming a poly-silicon layer on the first surface of the substrate.

Optionally, the first treatment includes: an atomic surface treatment.

Optionally, the first treatment further includes: a heating treatment in which the substrate is heated until a temperature of the substrate reaches a steady state and the steady state is maintained for a first period.

Optionally, the heating treatment includes: heating the substrate and maintaining for a first period after a temperature of the substrate reaches a steady state.

Optionally, the first period is about 40 s~100 s, and the steady state is about 650° C.~700° C.

Optionally, the atomic surface treatment includes: treating the first surface with atoms to form a passivation layer on the first surface.

Optionally, the atoms in the atomic surface treatment are N-type or P-type dopants.

Optionally, the atomic surface treatment is performed by a chemical vapor deposition (CVD) process, a flow rate of a precursor in the CVD process is about 150 sccm~200 sccm, and the temperature of the CVD process is about 650° C.~800° C.

Optionally, the passivation layer covers at least a monoatomic layer on the first surface.

Optionally, the poly-silicon layer is formed by a chemical vapor deposition process which has a deposition pressure of about 200 Torr~280 Torr.

Optionally, the poly-silicon layer has doped ions, and the doped ions are same with the atoms in the atomic surface treatment when the atoms are in an ion state.

In an embodiment of the present disclosure, a method of manufacturing a silicon-germanium (SiGe) heterojunction bipolar transistor (HBT) device is provided, including: providing a semiconductor structure, where the semiconductor structure includes a first poly-silicon layer and an oxide layer sequentially formed on the semiconductor substrate, and a first opening formed in the first poly-silicon layer and the oxide layer, the first opening exposing a first single silicon layer in the semiconductor substrate; performing a first treatment on a first surface of the oxide layer and the first single silicon layer exposed by the first opening, so as to manipulate deposition rates of poly-silicon on different regions of the first surface to be closer; forming a second poly-silicon layer; forming a second opening in the second poly-silicon layer and performing silicidation to form a silicide layer; and forming a contact electrode via in the second opening.

Optionally, the first treatment includes: an atomic surface treatment.

Optionally, the first treatment further includes: a heating treatment in which the substrate is heated until a temperature of the substrate reaches a steady state and the steady state is maintained for a first period.

Optionally, the first period is about 40 s~100 s, and the steady state is about 650° C.~700° C.

Optionally, the atomic surface treatment includes: treating the first surface with atoms to form a passivation layer on the first surface.

Optionally, the atoms in the atomic surface treatment are N-type or P-type dopants.

Optionally, the atomic surface treatment is performed by a chemical vapor deposition (CVD) process, a flow rate of a precursor in the CVD process is about 150 sccm~200 sccm, and the temperature of the CVD process is about 650° C.~800° C.

Optionally, the passivation layer covers at least a monoatomic layer on the first surface.

Optionally, the poly-silicon layer is formed by a chemical vapor deposition process which has a deposition pressure of about 200 Torr~280 Torr.

Optionally, a thickness of the second poly-silicon layer is about 1000 Å to 1800 Å.

Optionally, the poly-silicon layer has doped ions, and the doped ions are same with the atoms in the atomic surface treatment when the atoms are in an ion state.

Optionally, the first opening further includes a spacer, wherein the spacer includes silicon nitride and/or silicon oxynitride and/or oxide materials and is exposed by the first opening.

According to the embodiments of the present disclosure, the method of manipulating deposition rates of poly-silicon and the method of manufacturing a SiGe HBT device include performing the first treatment on the first surface, where the first treatment includes the atomic surface treatment, and the first surface includes at least two of the oxide material region, the silicon nitride material region and the silicon material region. After the first treatment, the deposition rates of poly-silicon on the different material regions of the first surface can be similarly closer, thereby improving conformality of the poly-silicon layer formed on the first surface.

Furthermore, the first treatment further includes the heating treatment and the deposition pressure of the chemical vapor deposition process for forming the poly-silicon layer on the first surface is reduced, which can further reduce the differences in the deposition rates of poly-silicon between the different material regions of the first surface, thereby improving conformality of the poly-silicon layer formed on the first surface.

DETAILED DESCRIPTION

Figure 1A:
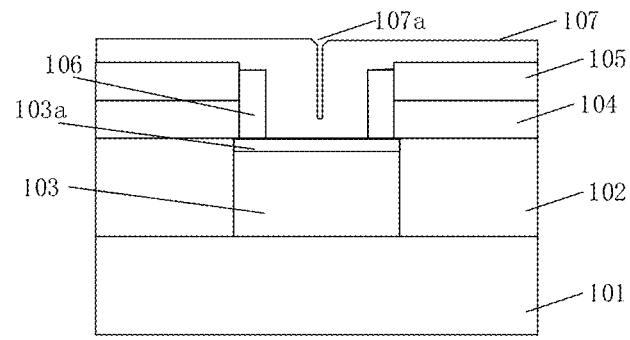
FIGS. 1(a) and 1(b) schematically illustrate cross-sectional views of intermediate structures of a SiGe HBT device in prior art.
Figure 1B:
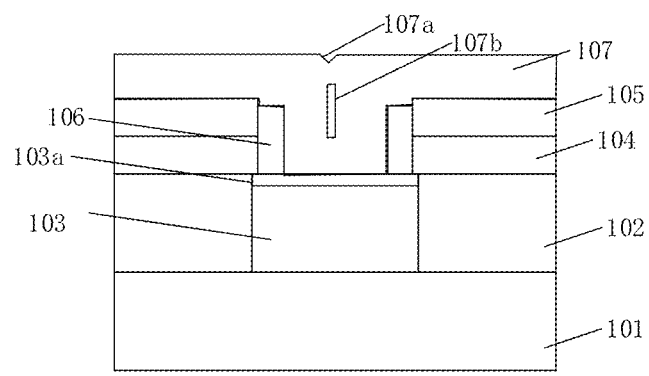

FIGS. 1(a) and 1(b) schematically illustrate cross-sectional views of intermediate structures of a silicon-germanium (SiGe) heterojunction bipolar transistor (HBT) device in prior art. As shown in FIGS. 1(a) and 1(b), the SiGe HBT device includes: a semiconductor substrate 101, a polycrystalline silicon-germanium (poly-SiGe) region 102 and a single crystalline SiGe (mono-SiGe) region 103 epitaxially grown on the semiconductor substrate 101, a poly-silicon layer 104, an oxide mask 105, a spacer 106, and an ion-doped poly-silicon layer 107. The mono-SiGe region 103 further includes a monocrystalline silicon layer 103a which is very thin and covers the mono-SiGe region 103. As the emitter opening area of the SiGe HBT device gets smaller due to scaling, the manufacturability of poly-silicon thin film in the emitter opening area (the ion-doped poly-silicon layer 107 shown in FIGS. 1(a) and 1(b)) becomes more difficult. As the thickness of the ion-doped poly-silicon layer 107 increases during deposition, a seam 107a as shown in FIG. 1(a) may be formed in the ion-doped poly-silicon layer 107, or a combination of the seam 107a and a void 107b as shown in FIG. 1(b) may be formed, which then could affect the contact electrode via formation in subsequent steps and degrade the SiGe HBT device electrical performances.

In prior art, the ion-doped poly-silicon layer 107 is usually formed in the following way: etching the poly-silicon layer 104 and the oxide mask 105 to form a first opening exposing the monocrystalline silicon layer 103a; forming the spacer 106; and forming the ion-doped poly-silicon layer 107.

It is found that formation of the seam 107a or the void 107b as shown in FIGS. 1(a) and 1(b) is mainly due to different deposition rates of ion-doped poly-silicon on three different regions constructed by different materials. Specifically, the ion-doped poly-silicon layer 107 is formed on a surface of the spacer 106 which is made of silicon nitride, a surface of the oxide mask 105 which is made of silicon oxide and a surface of the monocrystalline silicon layer 103a which is made of single monocrystalline silicon.

Figure 3:
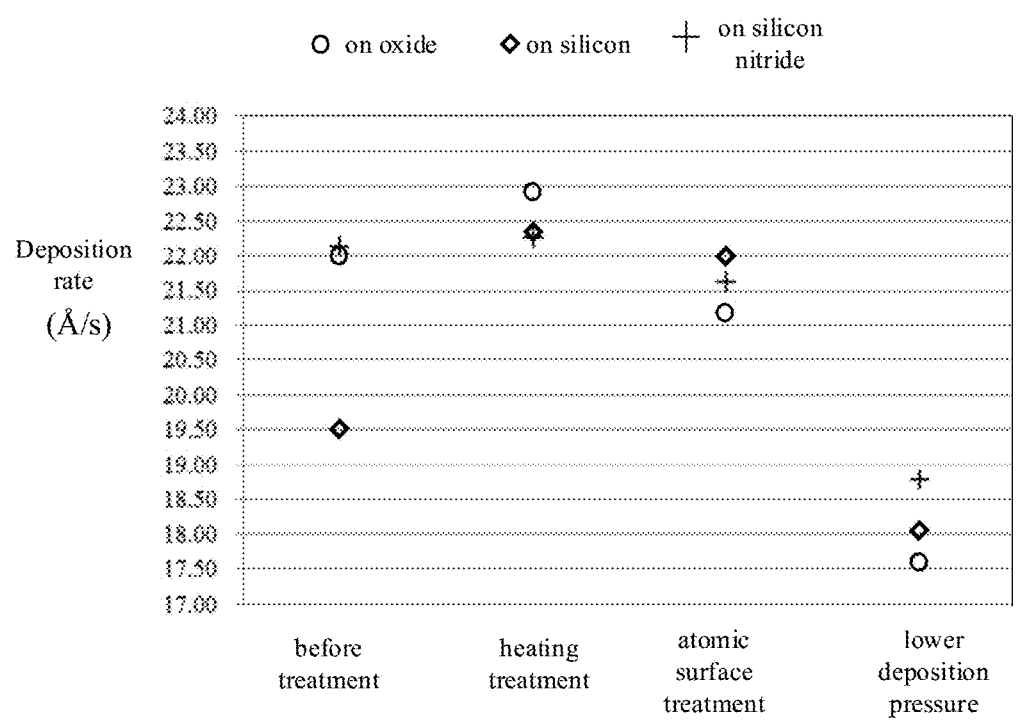
FIG. 3 schematically illustrates deposition rates of arsenic-doped poly-silicon on surfaces of different materials under different conditions according to an embodiment of the present disclosure.

FIG. 3 schematically illustrates deposition rates of arsenic-doped poly-silicon on surfaces of different materials which include silicon oxide, silicon nitride and silicon and are located on a polished section under different conditions, according to an embodiment of the present disclosure. As shown in FIG. 3, without performing any treatment, deposition rate of arsenic-doped poly-silicon on surfaces of silicon oxide and silicon nitride is about 22 Å/s, and & deposition rate of arsenic-doped poly-silicon on a surface of silicon is about 19.5 Å/s. Due to these differences during deposition, portions of the poly-silicon layer deposited on the oxide mask 105 and the spacer 106 will be thicker than a portion of the poly-silicon layer deposited on the monocrystalline silicon layer 103a, resulting in the seam 107a (FIG. 1(a)) or the void 107b (FIG. 1(b)) formation when the portions of the poly-silicon layer deposited on the oxide mask 105 from two sides of the opening area connected and block the routes for atom precursors to reach the beneath growing layer within the emitter window.

Figure 2:
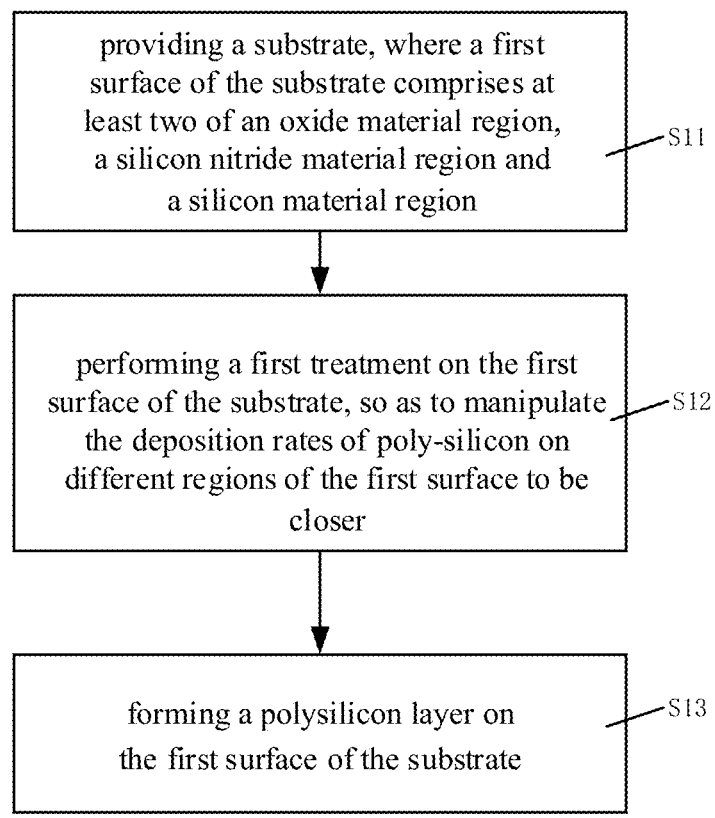
FIG. 2 schematically illustrates a flow chart of a method of manipulating deposition rates of poly-silicon according to an embodiment of the present disclosure.

In order to solve the problems described above, a method of manipulating deposition rates of poly-silicon is provided in an embodiment of the present disclosure. FIG. 2 schematically illustrate a flow chart of the method of manipulating the deposition rate of poly-silicon according to an embodiment. As shown in FIG. 2, the method includes the following steps: in S11, providing a substrate, where a first surface of the substrate includes at least any two from an oxide material region, a silicon nitride material region and a silicon material region; in S12, performing a first treatment on the first surface of the substrate, so as to manipulate the deposition rates of poly-silicon on different regions of the first surface to be closer; in S13, forming a poly-silicon layer on the first surface of the substrate.

The first surface could be flat, grooved or convex. In embodiments of the present disclosure, the first surface is grooved, and the first surface includes an oxide material region, a silicon nitride material region and a silicon material region.

In an embodiment, the first treatment includes an atomic surface treatment. Atoms used in the atomic surface treatment may be N-type or P-type dopants, e.g. arsenic atoms, phosphorus atoms or boron atoms. In embodiments of the present disclosure, arsenic atoms are used. The atomic surface treatment is performed by a chemical vapor deposition process. Specifically, gaseous arsenic atoms are introduced on the first surface with a flow rate around 150 sccm-200 sccm, and a temperature around 650° C.-800° C. The surface treatment produces an arsenic passivation layer including at least a monoatomic layer and covering the entire first surface.

In one embodiment, the poly-silicon layer is doped with the same atoms in the atomic surface treatment when they are in ionic state. For example, if the poly-silicon layer is required to be doped with arsenic, then the atomic surface treatment should be performed with arsenic atoms; if the poly-silicon layer is required to be doped with phosphorus, then the atomic surface treatment should be performed with phosphorus atoms; if the poly-silicon layer is required to be doped with boron, then the atomic surface treatment should be performed with boron atoms. As shown in FIG. 3, after the atomic surface treatment, the deposition rates of the ion-doped poly-silicon on the first surface which includes the silicon oxide material area, the silicon nitride material area and the single crystal silicon material area are between 21 Å/s and 22 Å/s which are very close. Specially, the deposition rate of ion-doped poly-silicon layer on single silicon is the highest which is the more preferable. Therefore, thicknesses of the poly-silicon layers formed on the three different material regions of the first surface are more uniform which is helpful in avoiding formation of the seam 107a or the void 107b as shown in FIGS. 1(a) and 1(b).

In an embodiment, the first treatment further includes a heating treatment. Specifically, the substrate is heated until a temperature of the substrate reaches a steady state which is maintained for a first period. And the heating treatment may be performed before, after or at the same time with the atomic surface treatment. In an embodiment, the first period is about 40 s~100 s, and the temperature of the steady state is about 650° C.~700° C. Referring to FIG. 3, since the temperature of the substrate is maintained for a long time after reaching the steady state, surface reaction rates on the different material regions of the substrate become closer. Therefore, the deposition rates of the ion-doped poly-silicon on the first surface which includes the oxide material area, the silicon nitride material area and the silicon material area are between 22 Å/s and 23 Å/s which are very close. The thicknesses of the poly-silicon layer formed on the different material regions of the first surface are more uniform which is helpful in avoiding formation of the seam 107a or the void 107b as shown in FIGS. 1(a) and 1(b). However, on devices with strict thermal budget control, prolonged heating treatment is not so favorable.

In one embodiment, the poly-silicon layer is formed through a chemical vapor deposition process with a deposition pressure of about 200 Torr to 280 Torr, while in prior art, the deposition pressure is about 280 Torr~300 Torr. Referring to FIG. 3, with the reducing pressure, the deposition rates of poly-silicon on the oxide material region, the silicon material region and the silicon nitride material region of the first surface are manipulated to around 17.5 Å/s~19 Å/s. In another words, after reducing the deposition pressure, the deposition rates of the ion-doped poly-silicon on the different material regions of the first surface can be similarly closer. The thicknesses of the poly-silicon layer formed on the different material regions of the first surface are more uniform which is helpful in avoiding formation of the seam 107a or void 107b as shown in FIGS. 1(a) and 1(b). However, the process throughput may be influenced with lower deposition rate.

In summary, the method of manipulating the deposition rates of poly-silicon provided in the embodiments of the present disclosure can make the deposition rates of poly-silicon on the first surface including at least two of the oxide material region, the silicon nitride material region and the silicon material region to be closer, thereby improving conformality of the poly-silicon layer formed on the first surface.

Figure 4:
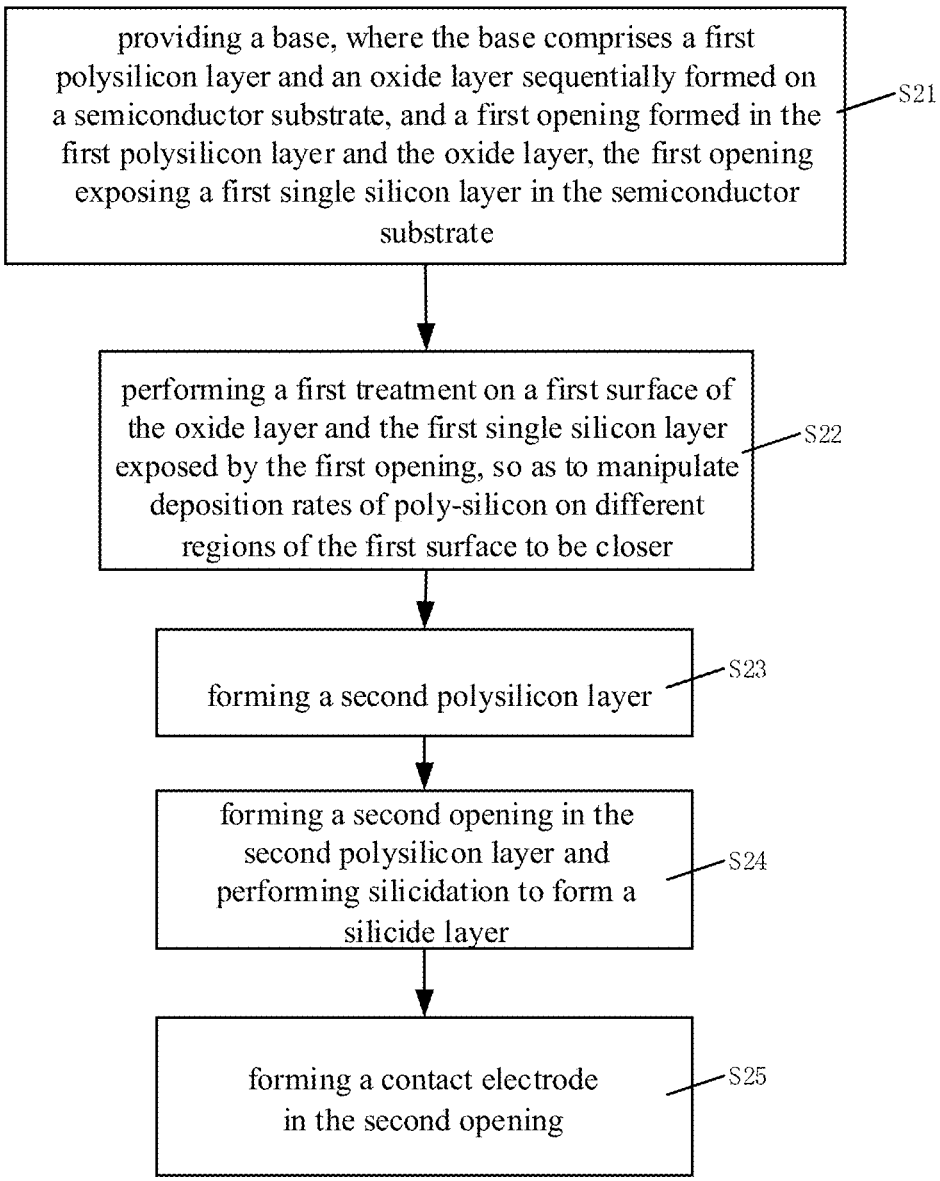
FIG. 4 schematically illustrates a flow chart of a method of manufacturing a silicon-germanium (SiGe) heterojunction bipolar transistor (HBT) device according to an embodiment of the present disclosure.

FIG. 4 schematically illustrates a flow chart of a method of manufacturing a silicon-germanium (SiGe) heterojunction bipolar transistor (HBT) device according to an embodiment of the present disclosure. Referring to FIG. 4, the method of manufacturing the SiGe HBT device includes the following steps: S21-S25. FIGS. 5-8 are schematic cross-sectional views of intermediate structures of a SiGe HBT device according to an embodiment of the present disclosure.

Figure 5:
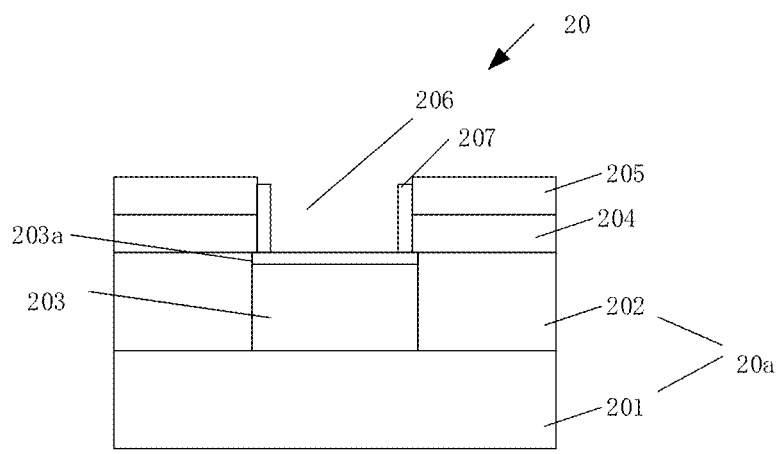
FIGS. 5-8 are schematic cross-sectional views of intermediate structures of a SiGe HBT according to an embodiment of the present disclosure.

Referring to FIG. 5, in S21, a semiconductor structure 20 is provided, wherein the semiconductor structure 20 includes: a first poly-silicon layer 204 and an oxide layer 205 formed on a semiconductor substrate 20a, and a first opening 206 formed in the first poly-silicon layer 204 and the oxide layer 205, where the first opening 206 exposes a first single silicon layer 203a in the semiconductor substrate 20a. In an embodiment, the semiconductor substrate 20a includes a silicon substrate 201 and a SiGe substrate formed on the silicon substrate 201. The SiGe substrate includes a polycrystalline SiGe (poly-SiGe) region 202 and a single crystalline SiGe (mono-SiGe) region 203. The mono-SiGe region 203 further includes the first single silicon layer 203a which is very thin and covers the mono-SiGe region 203.

Referring to FIG. 5, in S22, a first treatment is performed on a first surface of the semiconductor structure 20, where the first surface includes a surface of the oxide layer 205 and a surface of the first single silicon layer 203a exposed by the first opening 206, so as to manipulate deposition rates of poly-silicon on the surface of the oxide layer 205 and the surface of the first single silicon layer 203a exposed by the first opening 206 to be closer.

In an embodiment, the first treatment includes atomic surface treatment. Atoms in the atomic surface treatment are N-type or P-type dopants, for example, the atoms may include: arsenic atoms, phosphorus atoms or boron atoms. In embodiments of the present disclosure, arsenic atoms are taken as an example for illustration. The atomic surface treatment is performed by a chemical vapor deposition process. Specifically, gaseous arsenic atoms are introduced on the first surface, a flow rate of the gaseous arsenic atoms is about 150 sccm~200 sccm, and a temperature of the chemical vapor deposition process is about 650° C.~800° C. And the chemical vapor deposition process lasts until the arsenic atoms cover the first surface, and form a passivation layer of arsenic atoms on the first surface, where the passivation layer covers at least a monoatomic layer on the first surface.

In an embodiment, the first treatment further includes a heating treatment. Specifically, the semiconductor structure 20 is heated until a temperature of the semiconductor structure 20 reaches a steady state, and the temperature of the steady state is maintained for a first period. And the heating treatment may be performed before, after or at the same time with the atomic surface treatment. In an embodiment, the first period is about 40 s~100 s, and the temperature of the steady state is about 650° C.~700° C. In some embodiments, the heating treatment may be performed on the semiconductor structure 20 first, and after the temperature of the semiconductor structure 20 reaches about 650° C.~700° C., the temperature is maintained for at least 40 s; and then the atomic surface treatment of the semiconductor structure 20 can be started. In some embodiments, the heating treatment and the atomic surface treatment of the semiconductor structure 20 may be started at the same time. In some embodiments, the atomic surface treatment may be performed on the semiconductor structure 20 first, and then the heating treatment is performed; and after the temperature of the semiconductor structure 20 reaches about 650° C.~700° C., the temperature is maintained for at least 40 s.

In one embodiment, the first opening 206 further includes a spacer 207, wherein the spacer 207 includes silicon nitride and/or silicon oxynitride and/or oxide materials and is exposed by the first opening 206. In this embodiment, the first surface on which the atomic surface treatment is performed includes: a surface of the oxide layer 205, a surface of the first single silicon layer 203a exposed by the first opening 206 and a surface of the spacer 207. The implementations and principles of the atomic surface treatment may refer to the embodiments of the present disclosure described above, and will not be repeated here.

Figure 6:
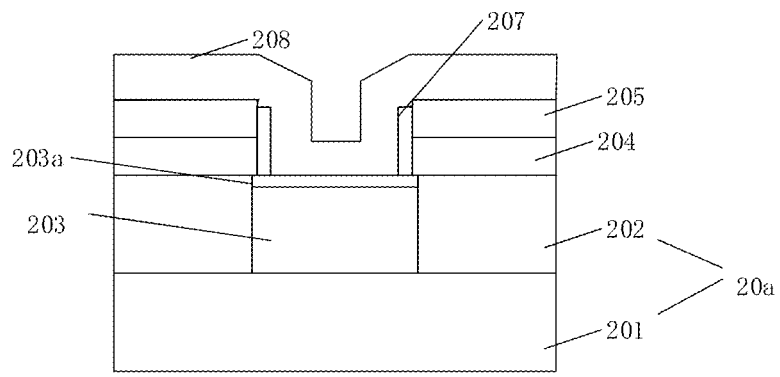

Referring to FIG. 6, in S23, a second poly-silicon layer 208 is formed.

In an embodiment, after the first treatment, the second poly-silicon layer 208 is formed on the first surface which includes the surface of the oxide layer 205, the surface of the first single silicon layer 203a and the surface of the spacer 207 with a chemical vapor deposition process.

In one embodiment, the second poly-silicon layer 208 is ion-doped. The doped ions are same with the atoms in the atomic surface treatment when they are in ion state. For example, if the atomic surface treatment is performed with arsenic atoms, the poly-silicon layer is doped with arsenic ions; if the atomic surface treatment is performed with phosphorus atoms, the poly-silicon layer is doped with phosphorus ions; if the atomic surface treatment is performed with boron atoms, the poly-silicon layer is doped with boron ions. As shown in FIG. 3, after the atomic surface treatment, the deposition rates of the iron-doped poly-silicon on the first surface which includes the oxide material area, the silicon nitride material area and the silicon material area are between 21 Å/s and 22 Å/s; after the heating treatment, the deposition rates of the iron-doped poly-silicon on the first surface which includes the oxide material area, the silicon nitride material area and the silicon material area are between 22 Å/s and 23 Å/s. In other words, after the first treatment, the deposition rates of poly-silicon in different regions of the first surface which includes the oxide material region, the silicon nitride material region and the silicon material region can be similarly closer. Therefore, after the first treatment, the second poly-silicon layer 208 formed on the different material regions of the first surface become uniformly deposited.

In one embodiment, the second poly-silicon layer 208 is formed with a chemical vapor deposition process, and a deposition pressure of the chemical vapor deposition process is about 200 Torr to 280 Torr. In prior art, the deposition pressure of the chemical vapor deposition process used to form the second poly-silicon layer 208 is usually about 280 Torr~300 Torr. Compared with the prior art, the deposition pressure of the chemical vapor deposition process is reduced. Referring to FIG. 3, after the deposition pressure of the chemical vapor deposition process is reduced to about 200 Torr~280 Torr, the deposition rates of poly-silicon on the oxide material region, the silicon material region and the silicon nitride material region of the first surface are manipulated to be between 17.5 Å/s~19 Å/s. In other words, after reducing the deposition pressure, the deposition rates of the ion-doped poly-silicon on the different material regions of the first surface can be similarly closer, which facilitates the improvement in conformality of the second poly-silicon layer 208 formed on the different material regions of the first surface.

In one embodiment, the second poly-silicon layer 208 has a thickness of about 1000 Å to 1800 Å.

Figure 7:
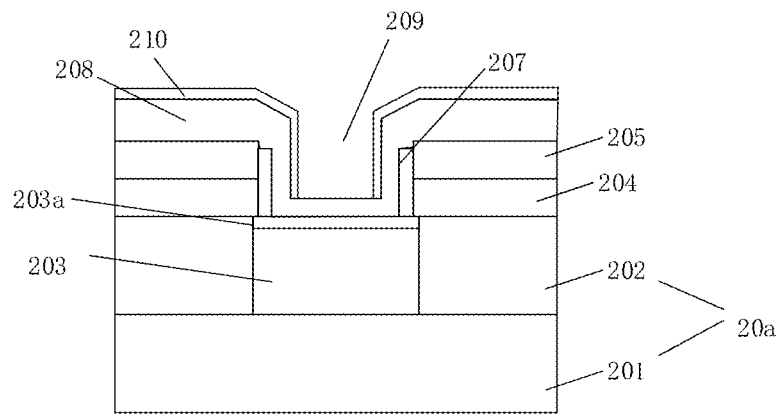

Referring to FIG. 7, in S24, a second opening 209 is formed in the second poly-silicon layer 208, and a silicidation process is performed to form a silicide layer 210.

According to the embodiments of present disclosure described above, the thickness of the second poly-silicon layer 208 formed on the first surface including the different material regions is uniform, and a width of the second opening 209 formed therein is large, and a surface of the second opening 209 is smooth and uniform, which facilitates forming the silicide layer 210 therein.

In one embodiment, the silicide layer 210 is formed with a chemical vapor deposition process.

Figure 8:
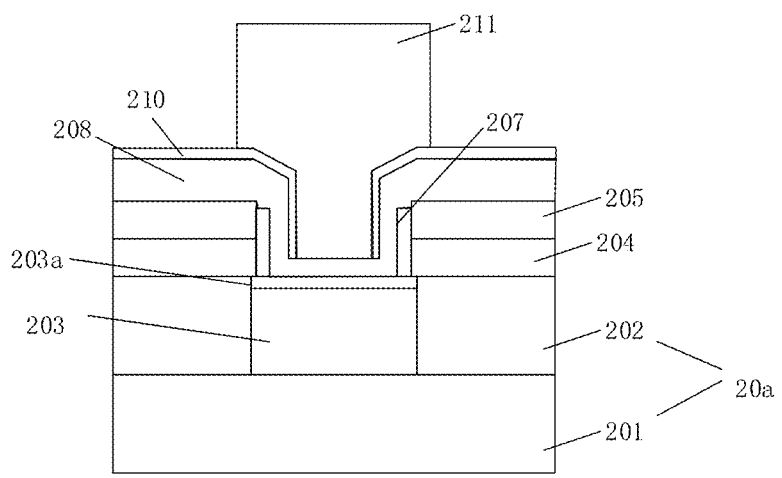

Referring to FIG. 8, in S25, a contact electrode via 211 is formed in the second opening 209.

In one embodiment, the contact electrode via 211 is formed with a chemical vapor deposition process. And the contact electrode via 211 includes tungsten material.

Figure 9:
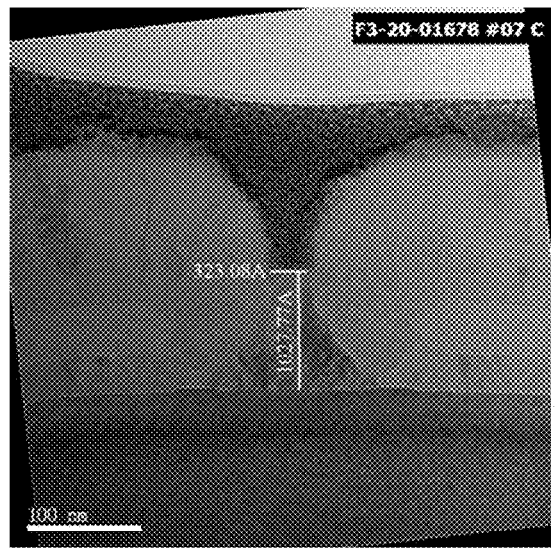
FIG. 9 shows TEM images of cross sections of SiGe HBT devices (a. in prior art b. according to an embodiment of the present disclosure) after a second poly-silicon layer is formed.
Figure 9:
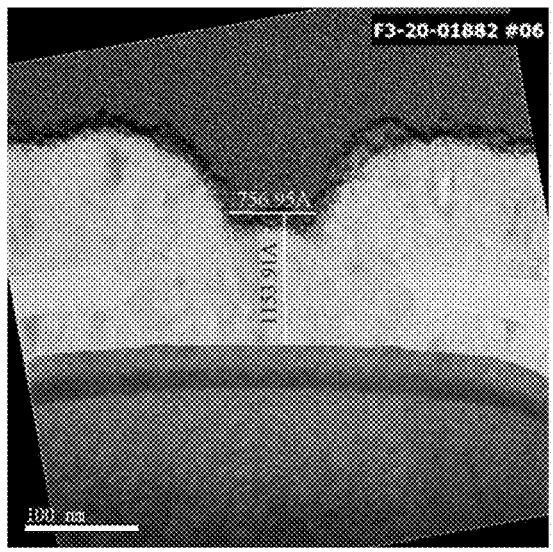

FIG. 9 shows comparison results of SiGe HBT devices under transmission electron microscope (TEM) analysis after a second poly-silicon layer is formed, where FIG. 9(a) is a TEM image of a cross section of a SiGe HBT device after the second poly-silicon layer is formed in the prior art, and FIG. 9(b) is a TEM image of a cross section of a SiGe HBT device after the second poly-silicon layer is formed according to an embodiment of the present disclosure. As shown in FIG. 9(a), a thickness of the second poly-silicon layer formed in the first opening is about 1027.77 Å, and a width of a first opening is about 323.08 Å, while in FIG. 9(b), a thickness of the second poly-silicon layer formed in the first opening is about 1153.91 Å, and a width of the first opening is about 756.95 Å. In other words, the thickness of the second poly-silicon layer in the first opening formed in the prior art is similar to that of the embodiments of the present disclosure, but the width difference gain is much more. The width of the first opening formed in the embodiments of the present disclosure is more than twice that of the prior art.

Figure 10:
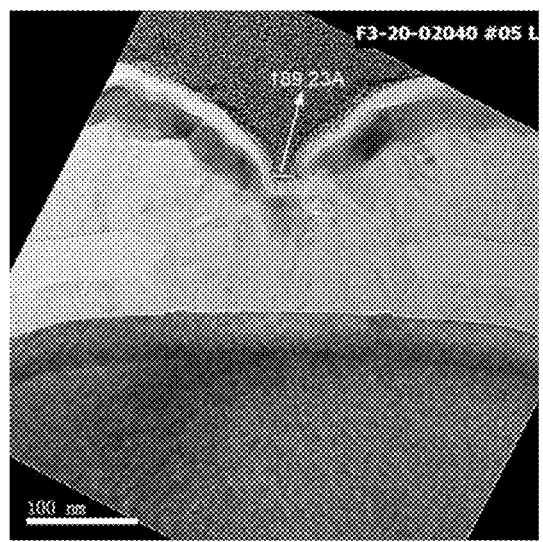
FIG. 10 shows TEM images of cross sections of SiGe HBT devices (a. in prior art b. according to an embodiment of the present disclosure) after a silicidation process.
Figure 10:
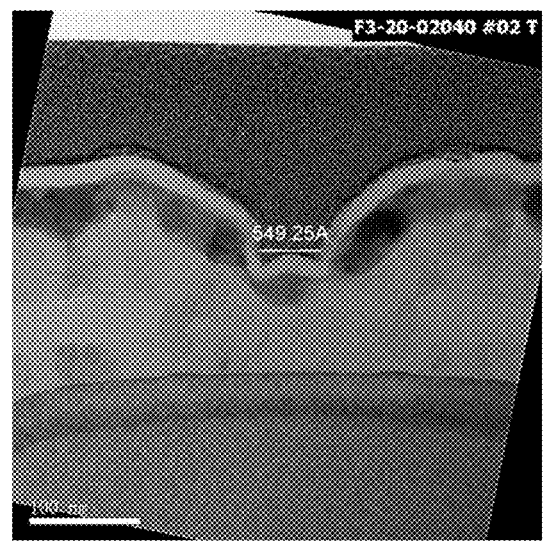

FIG. 10 shows comparison results of SiGe HBT devices under TEM analysis after a silicidation process. FIG. 10(a)

shows a TEM image of a cross section of a SiGe HBT device after the silicidation process in the prior art, and FIG. 10(b) shows a TEM image of a cross section of a SiGe HBT device after the silicidation process according to the embodiments of the present disclosure. As shown in FIG. 10(a), a width of the second opening after the silicidation process in the prior art is about 189.23 Å. As shown in FIG. 10(b), a width of the second opening provided in the embodiments of the present disclosure is about 549.25 Å. In other words, the width of the second opening formed according to the embodiments of the present disclosure is approximately three times that of the prior art.

Figure 11:
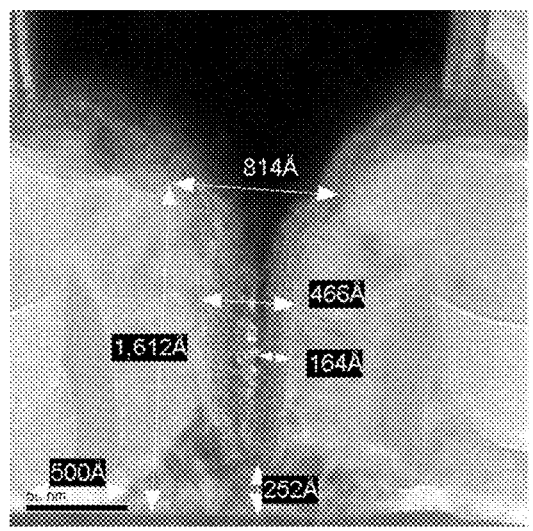
FIG. 11 shows TEM images of cross sections of SiGe HBT devices (a. in prior art b. according to an embodiment of the present disclosure) after a contact electrode via is formed.
Figure 11:
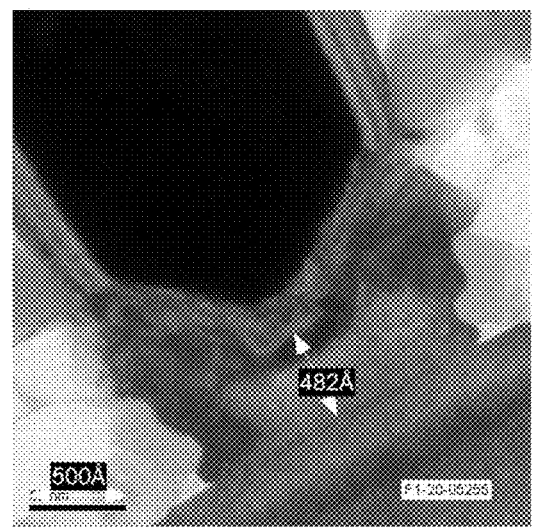

FIG. 11 shows comparison results of SiGe HBT devices under TEM analysis after a contact electrode via was formed, where FIG. 11(a) is a TEM image of a cross section of a SiGe HBT device after the contact electrode via formed in the prior art, and FIG. 11(b) is a TEM image of a cross section of a SiGe HBT device after the contact electrode via formed according to the embodiments of the present disclosure. As shown in FIG. 11(a), because the width of the second opening formed in the prior art is very small, a deep void could be formed at the bottom of the second opening, which would affect the subsequent contact electrode via formation in it. Since the deep void is very hard to fill with the conducting material, there will be deep narrow void beneath the contact electrode via, resulting in very poor conductivity. As shown in FIG. 11(b), the second opening formed in the embodiments of the present disclosure has a wider width, the surface of the second opening is smoother and more uniform, and there is no void formed underneath the second opening, which can facilitate a good formation of the contact electrode via and improve the conductivity.

In conclusion, according to the embodiments of the present disclosure, the first treatment which includes the atomic surface treatment is performed on the first surface including at least two of the oxide material region, the silicon nitride material region and the silicon material region and the deposition rates of poly-silicon on the different material regions of the first surface can be manipulated to be closer, thereby improving conformality of the poly-silicon layer formed on the first surface.

Furthermore, the first treatment further includes a heat treatment and the deposition pressure of the chemical vapor deposition for forming the poly-silicon layer on the first surface may be reduced, which can further reduce the deposition rate differences of poly-silicon on the different material regions of the first surface, thereby improving conformality of the poly-silicon layer formed on the first surface.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A method of manufacturing a silicon-germanium (SiGe) heterojunction bipolar transistor (HBT) device, comprising:
   providing a semiconductor structure, where the semiconductor structure comprises a first poly-silicon layer and an oxide layer sequentially formed on the semiconductor substrate, and a first opening formed in the first poly-silicon layer and the oxide layer, the first opening exposing a first single silicon layer in the semiconductor substrate;
   performing a first treatment on a first surface of the semiconductor structure which comprises a surface of the oxide layer and a surface of the first single silicon layer exposed by the first opening, so as to manipulate the deposition rates of poly-silicon on different regions of the first surface to be closer;
   forming a second poly-silicon layer;
   forming a second opening in the second poly-silicon layer and performing silicidation to form a silicide layer; and
   forming a contact electrode via in the second opening.

2. The method according to claim 1, wherein the first treatment comprises:
   an atomic surface treatment.

3. The method according to claim 2, wherein the first treatment further comprises: a heating treatment in which the substrate is heated until a temperature of the substrate reaches a steady state and the steady state is maintained for a first period, where the first period is 40s-100s and the steady state is 650° C.-700° C.

4. The method according to claim 2, wherein the atomic surface treatment comprises: treating the first surface with atoms to form a passivation layer on the first surface.

5. The method according to claim 4, wherein the atoms in the atomic surface treatment are N-type or P-type dopants.

6. The method according to claim 4, wherein the atomic surface treatment is performed by a chemical vapor deposition (CVD) process, a flow rate of a precursor in the CVD process is 150 sccm-200 sccm, and the temperature of the CVD process is 650° C.-800° C.

7. The method according to claim 4, wherein the passivation layer covers at least a monoatomic layer on the first surface.

8. The method according to claim 1, wherein the second poly-silicon layer is formed by a chemical vapor deposition process which has a deposition pressure of 200 Torr-280 Torr.

9. The method according to claim 1, wherein a thickness of the second poly-silicon layer is 1000 Å-1800 Å.

10. The method according to claim 4, wherein the poly-silicon layer has doped ions, and the doped ions are same with the atoms in the atomic surface treatment when the atoms are in an ion state.

11. The method according to claim 1, wherein the first opening further comprises a spacer, where the spacer comprises silicon nitride and/or silicon oxynitride and/or oxide materials and is exposed by the first opening.

* * * * *